(12) United States Patent
Lontka

(10) Patent No.: US 9,319,101 B2
(45) Date of Patent: Apr. 19, 2016

(54) SYSTEM AND METHOD FOR GROUND FAULT DETECTION IN A TRANSFORMER ISOLATED COMMUNICATION CHANNEL OF A NETWORK DEVICE

(71) Applicant: Siemens Industry, Inc., Alpharetta, GA (US)

(72) Inventor: Karen D. Lontka, Randolph, NJ (US)

(73) Assignee: Siemens Industry, Inc., Alpharetta, GA (US)

( * ) Notice: Subject to any disclaimer, the term of this patent is extended or adjusted under 35 U.S.C. 154(b) by 453 days.

(21) Appl. No.: 13/631,045

(22) Filed: Sep. 28, 2012

(65) Prior Publication Data

US 2014/0091807 A1  Apr. 3, 2014

(51) Int. Cl.
*G01R 31/14* (2006.01)
*H04B 3/46* (2015.01)
*G01R 31/02* (2006.01)

(52) U.S. Cl.
CPC ............... *H04B 3/46* (2013.01); *G01R 31/025* (2013.01)

(58) Field of Classification Search
CPC .... G01R 31/025; G01R 31/086; G01R 27/18; B60L 3/0069
USPC ......... 324/509, 512, 520, 521, 522, 525–528, 324/531, 537, 555; 361/42, 45, 69, 93.7, 361/78, 18, 64; 340/664, 649, 650, 651
See application file for complete search history.

(56) References Cited

U.S. PATENT DOCUMENTS

| | | | | |
|---|---|---|---|---|
| 3,976,987 A | * | 8/1976 | Anger | G01R 27/18 324/509 |
| 4,206,398 A | * | 6/1980 | Janning | G01R 31/021 324/509 |
| 5,224,149 A | * | 6/1993 | Garcia | H04B 3/46 375/213 |
| 5,422,929 A | * | 6/1995 | Hurst et al. | 379/4 |
| 5,862,200 A | * | 1/1999 | Sheets | H04B 5/00 379/2 |
| 6,040,778 A | * | 3/2000 | Hopkins | G01R 31/025 315/129 |

(Continued)

FOREIGN PATENT DOCUMENTS

EP     2466758 A1    6/2012
WO   2006096431 A2  9/2006

(Continued)

OTHER PUBLICATIONS

PCT Search Report for PCT Application No. PCT/US2013/060896 mailed Jan. 16, 2014. (9 pages).

(Continued)

*Primary Examiner* — Tung X Nguyen
*Assistant Examiner* — Thang Le

(57) ABSTRACT

A system and method for non-intrusive fault detection of a ground fault in a communication channel is provided. A bias voltage may be established on a first portion of the communication channel and a second portion of the communication channel. A first voltage may be detected across a first resistor electrically connected to the first and second portions of the communication channel. Data indicative of whether the ground fault exists in the first or second portions of the communication channel may be provided based on the detecting.

21 Claims, 9 Drawing Sheets

(56) References Cited

U.S. PATENT DOCUMENTS

| | | | |
|---|---|---|---|
| 7,113,121 B1 | 9/2006 | Sutardja et al. | |
| 7,711,970 B2 | 5/2010 | Keller | |
| 8,184,525 B2* | 5/2012 | Karam | 370/216 |
| 8,405,940 B2* | 3/2013 | Schweitzer et al. | 361/42 |
| 8,693,497 B2 | 4/2014 | Wei et al. | |
| 2002/0047629 A1* | 4/2002 | Kastner | 315/291 |
| 2002/0140433 A1 | 10/2002 | Lawson et al. | |
| 2004/0141265 A1* | 7/2004 | Angle | H02H 3/338 361/44 |
| 2004/0257743 A1* | 12/2004 | Chen | H02H 9/04 361/119 |
| 2005/0030677 A1* | 2/2005 | Aromin | H02H 1/0015 361/6 |
| 2006/0062030 A1 | 3/2006 | Keller | |
| 2006/0165097 A1 | 7/2006 | Caveney | |
| 2008/0040625 A1* | 2/2008 | Vorenkamp et al. | 713/340 |
| 2008/0170495 A1 | 7/2008 | Monse et al. | |
| 2008/0218330 A1 | 9/2008 | Biles et al. | |
| 2009/0060260 A1 | 3/2009 | Hou | |
| 2009/0180226 A1* | 7/2009 | Rogoll et al. | 361/79 |
| 2010/0131610 A1 | 5/2010 | Furtner et al. | |
| 2010/0149709 A1 | 6/2010 | Straka et al. | |
| 2010/0271039 A1* | 10/2010 | Durston et al. | 324/533 |
| 2011/0025341 A1* | 2/2011 | Lupaczyk et al. | 324/509 |
| 2011/0026411 A1 | 2/2011 | Hao et al. | |
| 2011/0082599 A1 | 4/2011 | Shinde et al. | |
| 2011/0122978 A1 | 5/2011 | Peichel et al. | |
| 2011/0254366 A1 | 10/2011 | Borchers | |
| 2012/0050001 A1 | 3/2012 | Koether | |
| 2013/0103220 A1* | 4/2013 | Eaves | H02J 3/12 700/293 |

FOREIGN PATENT DOCUMENTS

| | | |
|---|---|---|
| WO | 2006/127915 A2 | 11/2006 |
| WO | 2010141859 A1 | 12/2010 |

OTHER PUBLICATIONS

Anonymous: "Industrial Communication—Brochure". May 30, 2011. Retrieved from the Internet: URL: http://www.automation.siemens.com/mcms/infocenter/dokumentecenter/sc/ic/Documentsu20Brochures/6ZB5530-1AE02-OBB4.pdf. Retrieved on Jan. 26, 2012. (60 pages).

* cited by examiner

SYSTEM AND METHOD FOR GROUND FAULT DETECTION IN A TRANSFORMER ISOLATED COMMUNICATION CHANNEL OF A NETWORK DEVICE

CROSS-REFERENCE TO RELATED APPLICATIONS

This patent application is related to co-pending U.S. patent application Ser. No. 12/631,149, titled "System and Method for Fail-Safe Communication Across a Compromised Communication Channel of a Network Device" and filed the same day, the contents of which are hereby incorporated by reference for all purposes.

BACKGROUND

The present embodiments relate to a method and system for providing ground fault detection in a network device, and in particular, for detecting a ground fault in a transformer isolated communication channel of a network device, such as often employed in a fire safety system.

Fire safety systems may include fire alarm control panels connected with or coupled to other fire alarm equipment, such as voice panels, terminals, and/or workstations, over or via a communication channel or network. A conventional communication channel or network typically includes a standard transformer isolated communication channel, such as employed in standard Ethernet communication networks where each node of a network has an Ethernet Transformer for each channel or port on the network. The Standard for Control Units and Accessories for Fire Alarm Systems (UL 864), which governs fire alarm safety systems, requires that each fire alarm safety system be configured to detect ground faults. A ground fault may be an unintentional short or insufficient impedance path to ground or earth. The ground fault may be caused by or due to moisture or condensation, corrosion, oxidation, and/or other physical or conduction damage to a circuit.

Some ground fault detection devices are known. For example, U.S. Patent Publication No. 2011/0025341 describes a method of externally testing a network device for a ground fault. Specifically, an external circuit may be connected to a port of a network device to detect a ground fault in that port. Such a method is, however, intrusive and potentially introduces undesirable electrical effects that reduce transmission length.

SUMMARY

Different approaches for detecting ground fault detection in a transformer isolated communications channel of a network device or node are provided. Fault signaling or communication may also be provided in the event a communication path is compromised in a fire safety system or other network system. Ground fault detection and/or fault signaling or communication in a compromised communication path may also be provided across an extender or repeater used to extend the length of a communication channel.

In a first aspect, a ground fault detection system is provided for detecting a ground fault in a system having a first node, a second node, and a communication channel between the first node and the second node. The ground fault detection system includes a bias generator electrically connected to the communication channel. The bias generator is configured to establish a bias voltage on a first portion of the communication channel and a second portion of the communication channel. A first resistor electrically connects to the bias generator and the first and second portions of the communication channel. A first detector circuit is configured to detect a first voltage developed across the first resistor. The first detector circuit is further configured to output, based on the detection of the first voltage, a signal indicative of whether the ground fault exists in the communication channel of the system.

In a second aspect, a method is provided for detecting a ground fault in a communication channel between a first node and a second node. The method includes establishing a bias voltage on first and second portions of the communication channel. A first voltage developed across a first resistor electrically connected to the first and second portions of the communication channel is detected. An indication of whether the ground fault exists in the first or second portions of the communication channel is provided based on the detection.

In a third aspect, a fire safety system having a fire alarm control panel coupled to fire safety equipment via a communication channel is provided. The fire safety system includes a ground fault detection system configured to detect a ground fault on the communication channel of the fire safety system. The ground fault detection system includes a bias generator electrically connected to the communication channel. The bias generator is configured to establish a bias voltage on first and second portions of the communication channel. The ground fault detection system further includes a first detector circuit configured to detect a first voltage between the first and second portions of the communication channel. The first detector circuit is configured to output, based on the detection of the first voltage, an indication of whether the ground fault exists in the first or second portions of the communication channel.

Any one or more of the aspects described above may be used alone or in combination. These and other aspects, features and advantages will become apparent from the following detailed description of preferred embodiments, which is to be read in connection with the accompanying drawings. The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

DETAILED DESCRIPTION OF EMBODIMENTS

The present embodiments provide non-intrusive ground fault detection on transformer isolated communication channels (e.g., a copper Ethernet connection) in a network system such as a fire safety system. The present embodiments are compatible with Power Over IP networks and may provide a simple communication channel for communicating faults and/or alarms in a compromised system. The present embodiments also provide ground fault detection and notification or communication across extenders or repeaters for Ethernet coupled cable links or other communication channel links that collectively extend the communication channel between nodes in the system.

Figure 1:
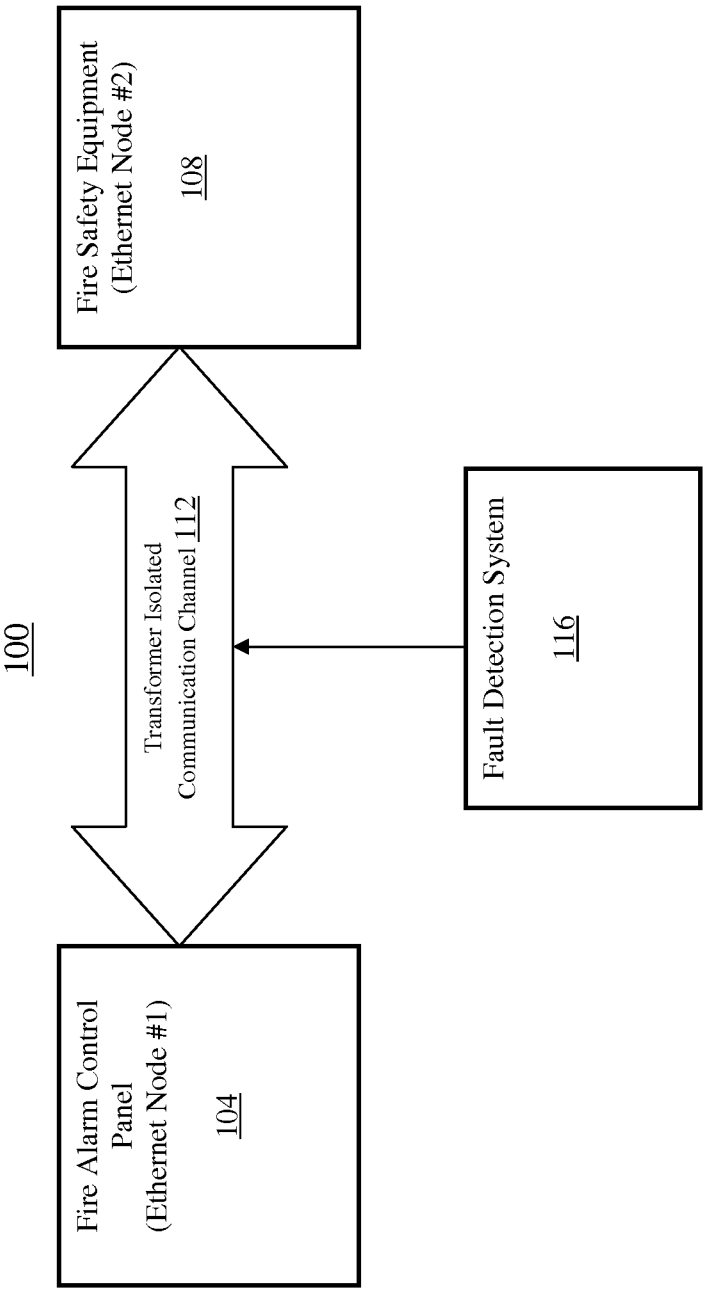
FIG. 1 shows a block diagram of one embodiment of a network system employing a fault detection system in accordance with the present invention.

FIG. 1 illustrates one embodiment of a network system 100 having nodes 104 and 108 that are connected via a transformer isolated communication channel 112, such as an Ethernet network cable. In the embodiment shown in FIG. 1, the network system 100 is depicted as a fire safety system operated, owned by, or otherwise associated with a fire safety system operator (e.g., individual, business or fire monitoring service). In this embodiment, the fire safety system 100 includes a fire alarm control panel 104 (i.e. the first node) connected to or with fire safety equipment 108 (i.e. the second node) via or over the communication channel 112. The system 100 further includes a ground fault detection system 116 coupled to or connected with the communication channel 112. Additional, different, or fewer components may be provided. For example, additional network nodes (e.g., fire alarm control panels 104, fire safety equipment 108), communication channels 112, and/or ground fault detection systems 116 may be provided.

The fire alarm control panel node 104 is a circuit, processor, display, user input, network interface, or other components for controlling the first safety equipment 108, interacting with users (e.g., user interface), and communicating with other panels or workstations. The fire alarm control panel node 104 may monitor and detect changes associated with the fire safety equipment 108 or in the communication channel 112.

Fire safety equipment node 108 may be or includes detectors, such as for example, fire, smoke, radiation, heat, carbon monoxide, ozone and/or other gas detectors. The fire safety equipment 108 may include one or more manual push and/or pull devices and/or manual alarm triggers (e.g., push button triggers, glass break triggers, etc.). Further yet, the fire alarm control panel node 104 may monitor any other known and/or later developed detector, trigger, and/or alert device as the first safety equipment node 108.

The fire safety equipment node 108 may include one or more audible sirens or horns, an alarm voice panel, sprinklers, visual indicators (e.g., signs, lights, etc.), computers (e.g., monitored or operated by the safety system operator), and/or other safety equipment not explicitly disclosed herein.

As explained in further detail below, each node 104 and 108 in the system 100 includes a coupling transformer for connecting the respective node to each communication channel 112. The fault detection system 116 connects to a center tap on a secondary side of each coupling transformer to monitor and detect ground fault conditions in the respective communication channel 112 as explained in reference to the embodiments herein. The communication channel 112 is a wire or wires. A single wire, untwisted pair, twisted pair, buss, or other wired communications may be used. Any type of wired channel (e.g., an Ethernet cable or a telephone cable) may be used. The communication channel 112 provides analog or digital signals between the fire alarm control panel 104 and the fire safety equipment 108. Uni-directional or bidirectional communications may be used. Any number of communications channels 112 may be provided, such as a separate channel for each component (e.g., device) of fire safety equipment 108 or for groups of components.

The ground fault detection system 116 generally includes one or more fault detection circuits configured to detect a ground fault in or on the communication channel 112. The ground fault detection system 116 may be connected at any location along the communications channel 112, such as at or near the fire control panel 104 (the "first node"), at or near the fire safety equipment 108 (the "second node"), or anywhere in between. Separate fault detection is provided for each communication channel 112 or the ground fault detection system 116 is switchably connected to perform sequential or simultaneous detection on different communication channels 112. The fault reporting equipment may be part of, connected to, or separate from the fire alarm control panel or first node 104 and/or the fire safety equipment or second node 108.

The ground fault detection system 116 may also include fault reporting equipment connected to the one or more fault detection circuits and configured to report or identify the detected ground fault and/or report or identify the presence of an alarm (e.g., fire) when the communication channel has been compromised. A separate communication path than the communication channel 112 is used. The fault reporting is to the fire control panel node 104 and/or to a workstation or other computer configured to receive the detected ground fault signal or report from the Fault Detection System 116.

Figure 2:
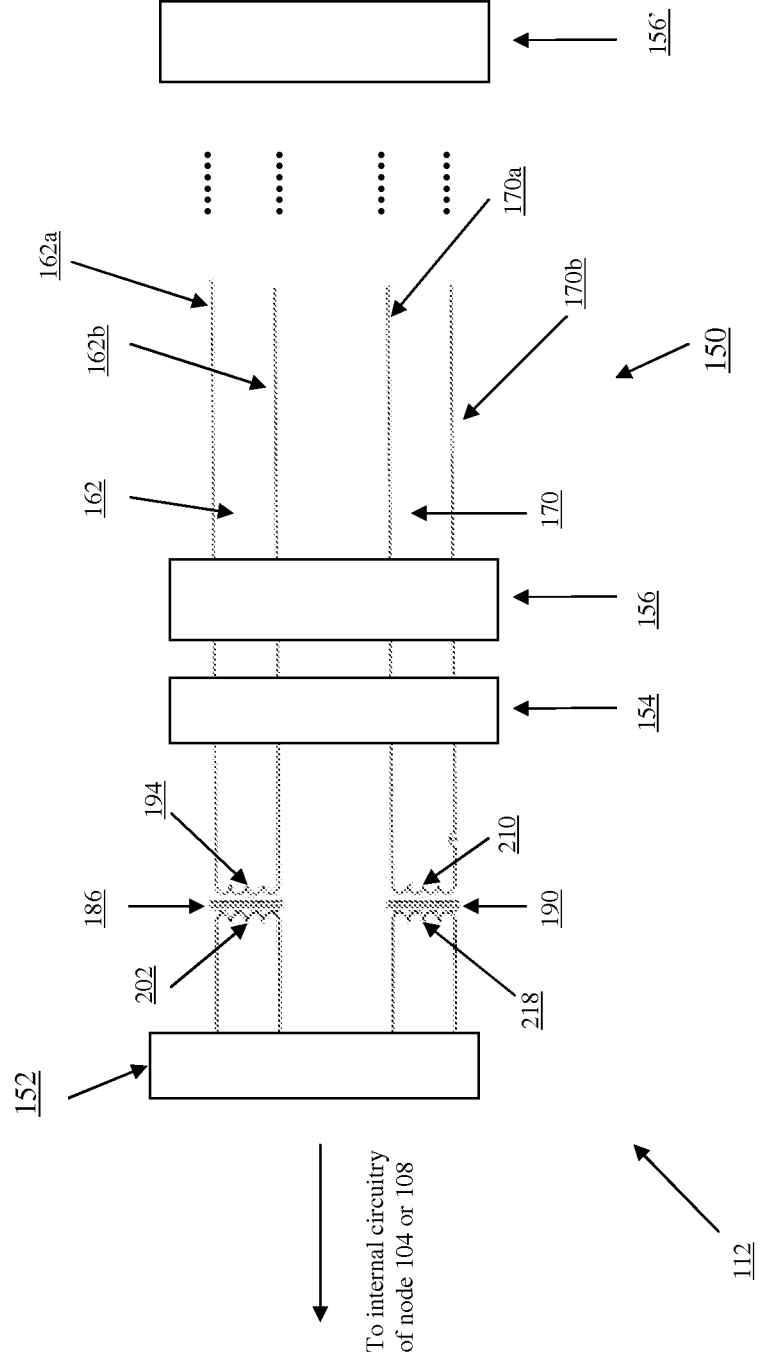
FIG. 2 shows one embodiment of a communication channel of the system of FIG. 1.

A representative portion of the communication channel 112 is shown in FIG. 2. As shown in FIG. 2, the communication channel 112 includes an Ethernet Physical Interface (PHY) 152, a pair of coupling transformers, a connector (e.g., an RJ45 jack) 154, and an Ethernet cable 150. In other embodiments, the communication channel 112 may include additional, fewer, or different components.

The PHY 152 is generally located within or inside the respective network node, such as the fire alarm control panel node 104, the safety equipment node 108, or other equipment connected as a network node. The PHY 152 may be any type of PHY, such as, for example, a TLK100PHP that supports IEEE 802.3u PCS, 100 Base-TX transceivers, and IEEE 1149.1 JTAG and is commercially available from Texas Instruments. The pair of coupling transformers includes a transmit coupling transformer 186 and a receive coupling transformer 190. The coupling transformers 186, 190 are located within or inside the respective network node, such as the fire alarm control panel node 104, the safety equipment node 108, or other equipment connected as a network node to the communication channel 112. The coupling transformers 186, 190 are coupled to the PHY 152 and to the connector 154 as shown in FIG. 2.

The Ethernet cable 150 may be any type of cable (e.g., a 10 BASE-T, 100 BASE-T, or 1000 BASE-T copper cable) with a plug 156. The cable 150 may be, one end, coupled to the connector 154 of the respective node via the plug 156. Though not specifically depicted herein, the cable 150 may be, on another end, coupled to a connector of another node, such as the fire alarm control panel node 104, the safety equipment node 108, or other equipment (e.g., downstream extenders) connected as a network node to the communication channel 112, via another plug 156'.

The Ethernet cable 150 includes a transmit conductor pair 162 and a receive conductor pair 170. In this embodiment, the transmit conductor pair 162 and the receive conductor pair 170 each include a twisted pair of conductors 162a and 162b, 170a and 170b. The transmit conductor pair 162 is coupled to the PHY 152 via the transmit coupling transformer 186. The receive conductor pair 170 is coupled to the PHY 152 via the receive coupling transformer 190. The coupling transformer 186 enables the transfer of an Ethernet signal or data bit packet stream between the transmit conductor pair 162 and the PHY 152, while the coupling transformer 190 enables the transfer of an Ethernet signal or data bit packet stream between the receive conductor pair 170 and the PHY 152. In other embodiments, the Ethernet cable 150 may include different or additional pairs of twisted conductors (each corresponding to a respective communication channel 112) and/or different or additional coupling transformers may be used. For example, when the Ethernet cable 150 is a 1000 BASE-T copper cable, the cable 150 has four pairs of twisted conductors and four coupling transformers may be employed by a respective node 104 or 108 to connect to all four communication channels 112. Any winding ratio may be used for the transformers 186 and/or 190, such as, for example, 1:1, without departing from the scope of the present invention.

The conductors 162a, 162b and 170a, 170b connect with the ends of the transformers 186 and 190, respectively, but may tap into other portions of the respective transformers 186 or 190. As shown in FIG. 2, the transmit coupling transformer 186 has one or more center taps 194 between outer taps on the output coupling portion (secondary winding) of the transformer and one or more center taps 202 between outer taps on the input coupling portion (primary winding) of the transformer. FIG. 2 also illustrates that the receive coupling transformer 190 has one or more center taps 210 between outer taps on the output coupling portion (secondary winding) of the transformer and one or more center taps 218 between outer taps on the input coupling portion (primary winding) of the transformer. The center taps 194, 202, 210, and/or 218 represent the electrical center between the endpoints of the respective transformer 186, 190. Depending on how the transformers 186, 190 are wound, the center taps 194, 202, 210, and/or 218 may or may not actually be located at the physical center (i.e. the half-way point along a winding) of the respective coupling transformer. The center taps 194, 202, 210, and/or 218 may be located at the physical center of the respective coupling transformers 186 and/or 190 when, for example, the transformers 186 and/or 190 are bifilar wound such that both halves of the transformers 186 and/or 190 are parallel to one another.

Figure 3:
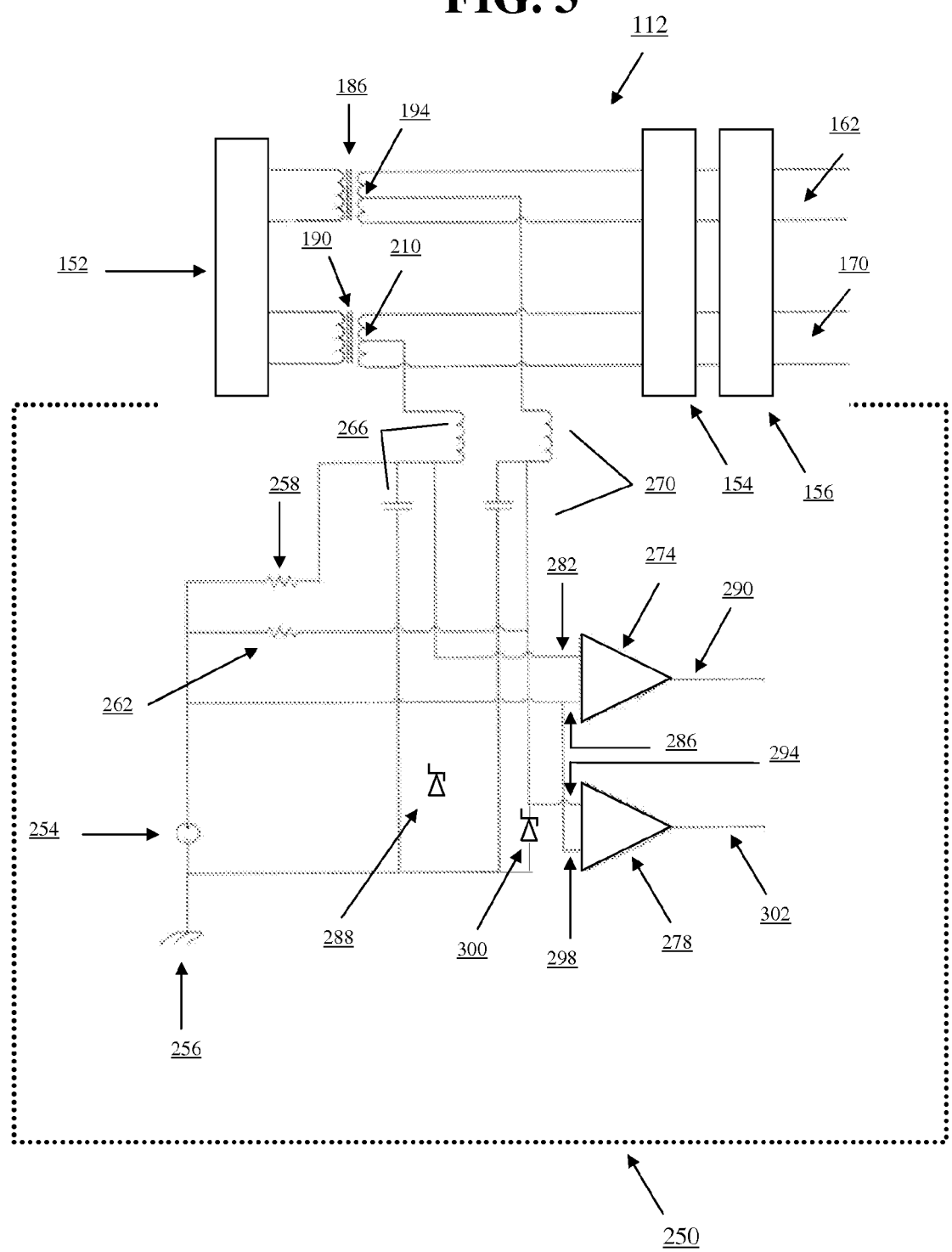
FIG. 3 shows one embodiment of a ground fault detection system for detecting a ground fault in the system of FIG. 1.

FIG. 3 illustrates one embodiment of the ground fault detection system 116 that may be used to detect a ground fault in or on the communication channel 112. In this embodiment, the ground fault detection system 116 is a ground fault detection system 250 (shown in a block formed of dashed lines) configured to detect a ground fault in or on the Ethernet cable 150. In other embodiments, the ground fault detection system 250 may be used to detect a ground fault in or on other communication channels 112.

The ground fault detection system 250 is electrically connected with or to a first portion of the communication channel 112 and a second portion of the communication channel 112. In this embodiment, the ground fault detection system 250 is electrically connected with or to the coupling transformers 186, 190. More specifically, the ground fault detection system 250 is electrically connected with or to one of the center taps 194 on the output coupling portion of the transmit coupling transformer 186 and one of the center taps 210 on the output coupling portion of the receive coupling transformer 190 (see FIG. 3).

The detection system 250 further includes a bias generator or source 254, a first resistor 258, a second resistor 262, a first filter 266, and a second filter 270. Additional, different, or fewer components may be provided. For example, additional resistors, capacitors, and/or inductors may be used. As another example, additional active circuits (e.g., amplifiers, transistors, or switches) may be used. These additional active circuits may provide, for example, additional filtering and/or hysteresis.

The bias generator 254 is electrically connected to or with earth ground 256, the first resistor 258, the second resistor 262, the first filter 266, the second filter 270, and first and second portions of the communication channel 112, particularly, the center taps 194, 210. In this embodiment, the bias generator 254 is a 12V DC bias voltage generator configured to establish, provide, or inject a 12V DC bias voltage to or on the center taps 194, 210. The bias voltage generator 254 may be a voltage rail, amplifier, voltage divider, or other source of voltage. Accordingly, a 6V DC bias voltage may be provided, injected, or established to or on the center tap 194 through the second resistor 262, and a 6 V DC bias voltage may be provided, injected, or established to or on the center tap 210 through the first resistor 258. In other embodiments, the bias generator 254 may be a different bias generator, such as, for example, a 24V DC bias voltage generator, other bias voltage generator, or a bias current generator. In these other embodiments, a different bias voltage or current would be provided, injected, or established to or on the center taps 194, 210. In further embodiments, the bias generator 254 may be electrically connected to or with, and thus provide a bias voltage or current to or on, any of the other center taps 202, 218 and/or any of the outer taps.

The first and second filters 266, 270 may be filters configured to decouple or attenuate high-frequency signals or noise from the communication channel 112 and/or the bias generator 254. In this embodiment, the first and second filters 266, 270 are bi-directional LC filters. In other embodiments, the first and/or second filters 266, 270 may be uni-directional filters (e.g., uni-directional low pass filters) or other bi-directional filters (e.g., RC filters).

The bi-directional LC filter 266 decouples or attenuates high-frequency signals from the receive conductor pair 170 of the Ethernet cable 150, the PHY 152, and the bias generator 254. This prevents unwanted or undesirable high-frequency signals from traveling from the receive conductor pair 170 and/or the PHY 152 to the bias generator 254, and unwanted or undesirable high-frequency signals from traveling from the bias generator 254 to the receive conductor pair 170 and/or the PHY 152. The bi-directional LC filter 270 decouples or attenuates high-frequency signals from the transmit conductor pair 162 of the Ethernet cable 150, the PHY 152, and the bias generator 254. This prevents unwanted or undesirable high-frequency signals from traveling from the transmit conductor pair 162 and/or the PHY 152 to the bias generator 254, and unwanted or undesirable high-frequency signals from traveling from the bias generator 254 to the transmit conductor pair 162 and/or the PHY 152. In the embodiment shown in FIG. 3, the LC filter 266 is electrically connected between the center tap 210 of the coupling transformers 190 that is connected to the receive conductor pair 170 or receive communication channel 112 and earth ground 256. The capacitor "C" employed in the LC filter 266 is connected in parallel with the first resistor 258 and the bias generator 254 such that the capacitor "C" of the LC filter 266 may charge to and hold a voltage corresponding the voltage drop across the first resistor 258. The LC filter 270 is correspondingly electrically coupled between the center tap 194 of the coupling transformers 186 and earth ground 256. The capacitor "C" at the LC filter 270 is likewise connected in series with the second resistor 262 and the bias generator 254.

The fault detection system 250 further includes a first detection circuit 274 and a second detection circuit 278. Though not specifically depicted herein, the first and second detection circuits 274, 278 each include a low-pass filter and a comparator (e.g., differential amplifier) or a window detector. In other embodiments, the first and/or second detection circuits 274, 278 may also include a pre-determined hysteresis element to prevent oscillation and/or additional filtering. As shown in FIG. 3, the first detection circuit 274 has a first input 282, a second input 286, a transient voltage (i.e. overvoltage) protector 288, and an output 290. The protector 288, which may be a zener diode, is electrically connected to or with the first input 282 and to or with the second input 286 through the first resistor 258. The protector 288 protects the first detection circuit 274 from voltage spikes or excessive voltage at the first and/or second inputs 282, 286 that exceed a pre-determined voltage threshold.

When the first detection circuit 274 includes a comparator (e.g. differential amplifier), the comparator compares the voltage at the first input 282 with the voltage at the second input 286. The voltage at the first input 282 is the same as the voltage across the first resistor 258. The second input 286 is connected to a reference voltage of the bias generator 254, so the voltage at the second input 286 is the reference voltage. The comparator outputs or produces the output 290 based on the comparison of or difference between the voltage at the first input 282 and the voltage at the second input 286. When the first detection circuit 274 includes a window detector, the window detector determines whether the first input 282 is outside of or within a threshold window or range having an upper limit voltage and a lower limit voltage. For example, the window detector determines whether the voltage at the first input 282 is outside of (i.e. less than) the lower limit voltage or is outside of (i.e. greater than) the upper limit voltage. The window detector outputs or produces the output 290 based on this determination.

The output 290 may be a ground fault detection signal (e.g., a binary signal). The output 290 may be a data (e.g., binary data (e.g., 0=good, 1=bad, or vice-versa), or a data bit in, for example, a communication word composed of other information) or a signal (e.g., an analog signal) that indicates that the voltage at the first input 282 is outside of the threshold window (i.e. the voltage at the first input 282 is less than the lower limit voltage or greater than the upper limit voltage) or is within the threshold window (i.e. the voltage at the first input 282 is greater than the lower limit voltage and less than the upper limit voltage). The output 290 may be indicative of the presence or existence of a ground fault in or on the receive conductor pair 170 when the voltage at the first input 282 is outside of the threshold window or range. Conversely, the output 290 may be indicative of no ground fault in or on the conductor pair 170 when the voltage at the first input 282 is within the threshold window or range.

The output 290 may be data or a signal that indicates the voltage values at the inputs 282, 286, respectively, or indicates the difference between the voltages at the inputs 282, 286. In turn, another circuit (e.g., an analog-digital converter and processor) may perform a direct input comparison or a threshold or tolerance comparison and, based on this direct input or threshold comparison, output the ground fault detection signal. The output 290 may be indicative of the presence or existence of a ground fault in or on the receive conductor pair 170 when the sensing point (e.g., the center tap 210) is non-zero (i.e. the difference between the voltages is non-zero because a voltage has developed across the first resistor 258), exceeds or is greater than a positive threshold value (i.e. a voltage has developed across the first resistor 258 that exceeds a positive threshold value), or is less than a negative threshold value (i.e. a voltage has developed across the first resistor 258 that is less than a negative threshold value). The output 290 may be indicative of no ground fault in or on the receive conductor pair 170 when the sensing point is zero (i.e. the difference between the voltages is zero), does not exceed (is less than) the positive threshold value (i.e. no voltage or a voltage below the positive threshold value has developed across the first resistor 258), or exceeds or is greater than the negative threshold (i.e. a voltage above the negative threshold value has developed across the first resistor 258).

The threshold value may, as noted above, be positive or negative. The threshold value may be equivalent to a percentage (e.g., 25%, 50%, etc.) of the reference voltage (the voltage at the second input 286) or may be a set voltage such as the output voltage of the bias generator 254. The threshold value may be set or adjusted based on, for example, the desired sensitivity of the ground fault detection system 250. In this embodiment, the ground fault detection system 250 is generally configured to detect a ground fault resistance (which is a function of or based on the resistance across the first resistor 258 and gain of the detection circuit 274). For example, the ground fault resistance may have a range of between 10 to 15 k ohms, 1000-2000 ohms, or other range (including, for example, higher or lower ground fault resistances) depending on the size of the resistor 258. The smaller the resistance, the smaller the range. A lower threshold value may, for example, be utilized when a more sensitive ground fault detection system 250 (one configured to detect, for example, a ground fault resistance of 15 k ohms, which, as noted above, is a function of or based on the resistance across the first resistor 258 and gain of the detection circuit 274), as compared to a less sensitive ground fault detection system 250 (one configured to detect, for example, a ground fault resistance of 10 k ohms), is desirable. The threshold value may, for example, be equal to 50% of the reference voltage (the voltage at the second input 286).

As is also shown in FIG. 3, the second detection circuit 278 has a first input 294, a second input 298, a transient voltage protector 300, and an output 302. The protector 300, which may also be a Zener diode, is electrically connected to or with the first input 294 and the second input 298 and protects the first detection circuit 278 from voltage spikes or excessive voltage at the first and/or second inputs 294, 298.

When the second detection circuit 278 includes a comparator, the comparator of the second detection circuit 278 compares the voltage at the first input 294 with the voltage at the second input 298. The voltage at the first input 294 is the same as the voltage across the second resistor 262. The second input 298 is connected to a reference voltage, such as the bias generator 254, so the voltage at the second input 298 is the reference voltage. The comparator outputs or produces the output 302 based on the comparison of or difference between the voltage at the first input 294 and the voltage at the second input 298. When the second detection circuit 278 includes a window detector, the window detector determines whether the first input 294 is outside of a threshold window or range having an upper limit voltage and a lower limit voltage. For example, the window detector determines whether the voltage at the first input 294 is outside of (i.e. less than) the lower limit voltage or is outside of (i.e. greater than) the upper limit voltage. The window detector outputs or produces the output 290 based on this determination.

The output 290 may be a data (e.g., binary data (e.g., 0=good, 1=bad, or vice-versa), or a data bit in, for example, a communication word composed of other information) or a signal (e.g., an analog signal) that indicates that the voltage at the first input 294 is outside of the threshold window (i.e. the voltage at the first input 294 is less than the lower limit voltage or greater than the upper limit voltage) or is within the threshold window (i.e. the voltage at the first input 294 is greater than the lower limit voltage and less than the upper limit voltage). The output 302 may be indicative of the presence or existence of a ground fault in or on the transmit conductor pair 162 when the voltage at the first input 294 is outside of the threshold window or range. Conversely, the output 302 may be indicative of no ground fault in or on the conductor pair 162 when the voltage at the first input 294 is within the threshold window or range.

The output 302 may be data or a signal that indicates the different voltages at the inputs 294, 298, respectively, or the difference between the voltages at the inputs 294, 298. In turn, another circuit (e.g., an analog-digital converter and processor) may perform an outright comparison or a threshold or tolerance comparison and, based on this outright or threshold comparison, output the ground fault detection signal. The output 302 may be indicative of the presence or existence of a ground fault in or on the transmit conductor pair 162 when the sensing point is non-zero (i.e. the difference between the voltages is non-zero because a voltage has developed across the second resistor 262), exceeds or is greater than a positive threshold value (i.e. a voltage has developed across the second resistor 262 that exceeds the threshold value), or is less than a negative threshold value (i.e. a voltage has developed across the second resistor 262 that is less than the threshold value). The output 302 may be indicative of no ground fault in or on the transmit conductor pair 162 when the sensing point is zero (i.e. the difference between the voltages is zero), does not exceed (is less than) the positive threshold value (i.e. no voltage or a voltage below the positive threshold value has developed across the second resistor 262), or exceeds or is greater than the negative threshold (i.e. a voltage above the negative threshold value has developed across the second resistor 262).

As with the threshold for the first detection circuit 274, the threshold value for the second detection circuit 278 may be positive or negative. The threshold value may be equivalent to a percentage (e.g., 25%, 50%, etc.) of the reference voltage (the voltage at the second input 298) or may be a set voltage. The threshold value may be set or adjusted based on, for example, the desired sensitivity of the ground fault detection system 250. In this embodiment, the ground fault detection system 250 is generally configured to detect a ground fault resistance (which is a function of or based on the resistance across the second resistor 262 and gain of the detection circuit 278). For example, the ground fault resistance may have a range of between 10 to 15 k ohms, 1000-2000 ohms, or other range (including, for example, higher or lower ground fault resistances) depending on the size of the resistor 258. The smaller the resistance, the smaller the range. A lower threshold value may, for example, be utilized when a more sensitive ground fault detection system 250 (one configured to detect, for example, a ground fault resistance of 15 k ohms), as compared to a less sensitive ground fault detection system 250 (one configured to detect, for example, a ground fault resistance of 10 k ohms), is desirable. The threshold value may, for example, be equal to 50% of the reference voltage (the voltage at the second input 298).

In another embodiment, the first and/or second detection circuits 274, 278 may include a comparator that compares the current at the first inputs 282, 294 with the current at the second inputs 286, 298, respectively. In such an embodiment, the current at the first inputs 282, 294 is the same as the current across or traveling through the first and second resistors 258, 262, respectively, and the current at the second inputs 286, 298 is the same as a reference current. Accordingly, the outputs 290, 302 are output or produced based on the comparison of or difference between the currents at the first inputs 282, 294 and the second inputs 286, 298. As with voltage, above, the comparator outputs or produces the output 290, 302 based on the comparison of or difference between the current at the inputs 282, 294 and the inputs 286, 298. In yet another embodiment, the first and/or second detection circuits 274, 278 may include a window detector that determines whether the inputs 282, 294, respectively, are outside of a window having an upper limit current and a lower limit current. In such an embodiment, the window detector determines whether the current at the input 282 and/or 294 is outside of (i.e. less than) the lower limit current or is outside of (i.e. greater than) the upper limit current. The window detector outputs or produces the output 302 based on this determination.

The output 290 may be a ground fault detection signal (e.g., a binary signal) based on a current input threshold. The output 290 may be data or a signal that indicates that the current at the first input 282 is outside of the window (i.e. the current at the first input 282 is less than the lower limit current or greater than the upper limit current). The output 290 may be data or a signal that indicates the different currents at the inputs 282, 286, respectively, or indicates the difference between the currents at the inputs 282, 286. In turn, another circuit (e.g., an analog-digital converter and processor) may perform an outright comparison or a threshold or tolerance comparison and, based on this outright or threshold comparison, output the ground fault detection signal. The outputs 290 and/or 302 may be indicative of the presence or existence of a ground fault in or on the conductors 162 and/or 170 when the sensing point (or respective center tap 194 or 210) is non-zero (i.e. the difference between the currents is non-zero because a current is traveling across the first and/or second resistors 258, 262), exceeds or is greater than a positive threshold value (i.e. a current is traveling across the first and/or second resistors 258, 262 that exceeds the threshold value), or is less than a negative threshold value (i.e. a current is traveling across the first and/or second resistors 258, 262 that is less than the threshold value). The output 290 may be indicative of no ground fault in or on the conductors 162 and/or 170 when the sensing point (or respective center tap 194 or 210) is zero (i.e. the difference between the currents is zero), does not exceed (is less than) the positive threshold value (i.e. no current or a current below the positive threshold value is traveling across the first and/or second resistors 258, 262), or exceeds or is greater than the negative threshold (i.e. a current above the negative threshold value is traveling across the first and/or second resistors 258, 262).

The fault detection system 250 is thus configured to detect a ground fault in or on the Ethernet cable 150 (e.g., in one or more of the conductor pairs 162 and 170). If, for example, a ground fault occurs on or in one of the receive conductors 170a or 170b, the receive conductor pair 170 has a path to ground. The bias voltage, which was established on the center tap 210, initiates current flow from the center tap 210 to the ground (via the newly formed path to ground on the one receive conductor 170*a* or 170*b*). In turn, current flows from the bias generator 254, through the first resistor 258 and through the inductor "L" of the LC filter 266, which previously presented a high impedance, to the ground. By virtue of the current flow through the first resistor 258, a voltage develops across the first resistor 258. The voltage at the first input 282, which, as noted above, is the same as the voltage that has developed across the first resistor 258, is thus different than the voltage at the second input 286. The first detection circuit 274, via the comparator, compares the voltages at the first input 282 and the second input 286 and, finding that the difference is non-zero or exceeds the threshold value, produces the ground fault detection signal 290. The signal 290 may thus indicate that a ground fault exists or is present in at least one of conductors 170*a* and 170*b* of the receive conductor pair 170.

When, however, a ground fault occurs on or in one of the transmit conductors 162*a* or 162*b*, the transmit conductor pair 162 has a path to ground. The bias voltage, which was established on the center tap 194, initiates current flow from the center tap 194 to the ground (via the newly formed path to ground one the one transmit conductor 162*a* or 162*b*). In turn, current flows from the bias generator 254, through the second resistor 262 and through the inductor "L" of the LC filter 270, which previously presented a high impedance, to the ground. By virtue of the current flow through the second resistor 262, a voltage develops across the second resistor 262. The voltage at the first input 294, which, as noted above, is the same as the voltage across the second resistor 262, is thus different than the voltage at the second input 298. The second detection circuit 278, via the comparator, compares the voltages at the first input 294 and the second input 298 and, finding that the difference is non-zero or exceeds the threshold value, produces the ground fault detection signal 302. The signal 302 may thus indicate that a ground fault exists or is present in or on at least one of the conductors 162*a* and 162*b* of the transmit conductor pair 162.

Figure 4:
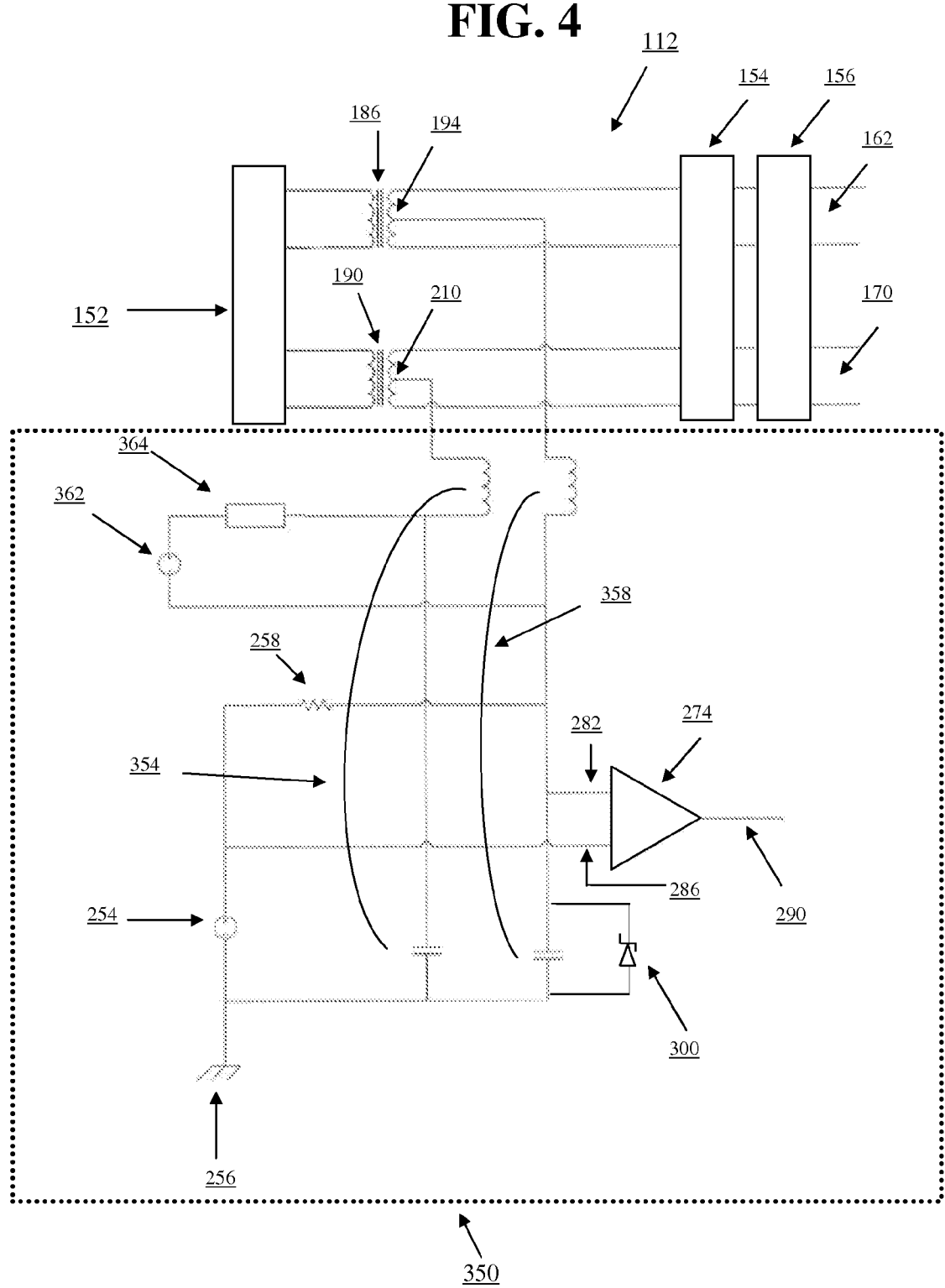
FIG. 4 shows another embodiment of a ground fault detection system for detecting a ground fault in the system of FIG. 1.

FIG. 4 illustrates another embodiment of the ground fault detection system that may be used to detect a ground fault in or on the communication channel 112. In this embodiment, the ground fault detection system 116 is a ground fault detection system 350 (shown in a block formed of dashed lines) configured to detect a ground fault in or on the Ethernet cable 150. In other embodiments, the ground fault detection system 350 may be used to detect a ground fault in or on other communication channels 112.

The ground fault detection system 350 is electrically connected with or to a first portion of the communication channel 112 and a second portion of the communication channel 112. In this embodiment, the ground fault detection system 350 is electrically connected with or to the coupling transformers 186, 190. More specifically, the ground fault detection system 350 is electrically connected with or to the center tap 194 on the output coupling portion of the transmit coupling transformer 186 and the center tap 210 on the output coupling portion of the receive coupling transformer 190 (see FIG. 4).

As shown in FIG. 4, the detection system 350 includes the bias generator 254, the first resistor 258, a first filter 354, a second filter 358, a power source 362, and current limiter 364. Additional, different, or fewer components may be provided.

In this embodiment, the bias generator 254 is electrically connected to or with the earth ground 256, the first resistor 258, the first filter 354, the second filter 358, and first and second portions of the communication channel 112, particularly, the center taps 194, 210. As described above, in one embodiment, the bias generator 254 is a 12V DC bias voltage generator configured to establish, provide, or inject a 12V DC bias voltage to or on the center taps 194, 210. A 6V or other DC bias voltage may be provided, injected, or established to or on each center tap 194, 210 through the first resistor 258.

As with the LC filter 266 described above, the LC filter 354 is, in the embodiment shown in FIG. 4, electrically connected between the center tap 210 of the coupling transformer 190 that is connected to the receive conductor pair 170 and to earth ground 256. In this embodiment, however, the capacitor "C" of the LC filter 354 is located at a different location or position, as compared to the capacitor "C" of the LC filter 266, relative to the center tap 210 and the earth ground 256 (see FIG. 4). As shown in FIG. 4, the capacitor "C" is connected in parallel with the power source 362, the first resistor 258, and the bias generator 254 such that the capacitor "C" of the LC filter 354 may charge to and hold a voltage corresponding to the voltage drop across the first resistor 258. As with the LC filter 270 described above, the LC filter 358 is electrically connected between the center tap 194 of the coupling transformer 186 that is connected to the transmit conductor pair 162 and to earth ground 256. In this embodiment, however, the capacitor "C" of the LC filter 358 is located at a different location or position, between the center tap 194 and the earth ground 256, as compared to the capacitor of the LC filter 270. As shown in FIG. 4, the capacitor "C" is connected in parallel with the power source 362, the first resistor 258, and the bias generator 254 such that the capacitor "C" of the LC filter 358 may charge to and hold a voltage corresponding to the voltage drop across the first resistor 258. The first and second filters 354, 358 are configured, like the first and second filters 266, 270, to decouple or attenuate high-frequency noise or signals from the transmit and receive conductor pairs 162, 170 of the Ethernet network, the PHY 152, and/or the bias generator 254.

The power source 362 is a DC power over Ethernet (POE) source such as power sourcing equipment (PSE) (e.g., a switch) or a powered device (e.g., wireless access point, IP phone, IP camera). As shown in FIG. 4, the power source 362 is electrically connected to the transmit conductor pair 162 and the receive conductor pair 170 through the respective center taps 194, 210. In other embodiments, the power source 362 may be electrically connected to other conductors in the Ethernet cable 150 and/or other communication channels 112. The power source 362 is configured to supply or provide power to the fire control panel node 104, the fire safety equipment node 108, and/or any other network nodes connected to or coupled with the Ethernet cable 150. Though not specifically depicted herein, the power source 362 may also be used in connection with the fault detection system 250 and/or any other fault detection system not explicitly described herein. The current limiter 364 is electrically connected to or with the power source 362 and is configured to protect excess or harmful current from reaching and, in turn, damaging the power source 362.

Unlike the fault detection system 250, which includes two resistors and two fault detection circuits, the fault detection system 350 only includes one resistor, the resistor 258, and only one fault detection circuit, the first detection circuit 274. In turn, the fault detection system 350 may be less expensive to manufacture than the fault detection system 250. At the same time, however, the fault detection system 350, though still configured to detect a ground fault in or on the Ethernet cable 150, only has one sensing point, such that it is unable to determine or identify which specific twisted pair conductor 162*a* and 162*b* or 170*a* and 170*b* is faulted (unlike the fault detection system 250, which is configured to identify which twisted pair conductor is faulted). For example, when no ground fault is present on the transmit conductor pair 162 or the receive conductor pair 170, then the center taps 194 and 210 remain at a balanced, or unchanging, voltage, which prevents the inductor "L" of each LC filter 354 and 358 from conducting current, and, thus, presents a high impedance to the input 282 of the detection circuit 274. However, regardless of whether the ground fault occurs in the transmit conductor pair 162 or the receive conductor pair 170, once the ground fault occurs, current flows from the bias generator 254 through the internal impedance of the power source 362 (if the ground fault occurs in the receive conductor pair 170) and through the first resistor 258 and the inductor "L" of the respective LC filter 354 or 358 to the ground. Accordingly, the first detection circuit 274 is able to recognize that the voltage at the first input 282, which is the same as the voltage across the first resistor 258, is different (i.e. greater) than the voltage at the second input 286. The output 290 produced by the first detection circuit 274 thus indicates that a ground fault exists in or on the Ethernet cable 150.

If the ground fault occurs on or in the transmit conductor pair 162, and not on or in the receive conductor pair 170, then the impedance on the inductor "L" of the LC filter 354 connected to the center tap 210 of the receive conductor pair 170 remains high since the voltage remains balanced at this center tap 210. However, if a ground fault occurs on or in the transmit conductor pair 162, then the associated tap 194 voltage is no longer balanced, causing the inductor of the LC filter 162 to conduct current through the first resistor 258 (but not through the power source 362 or current limiter 364). The output 290 in this embodiment does not identify whether the ground fault exists or occurred in the transmit conductor pair 162 or the receive conductor pair 170. Moreover, because the fault detection system 350 only has one sensing point, the ratio of the bias voltage from the bias generator 254 to the voltage supplied by the power source 362 may be different than the ratio utilized with or in the fault detection system 250. This may cause the fault detection system 350 to be less sensitive than the fault detection system 250.

Figure 5:
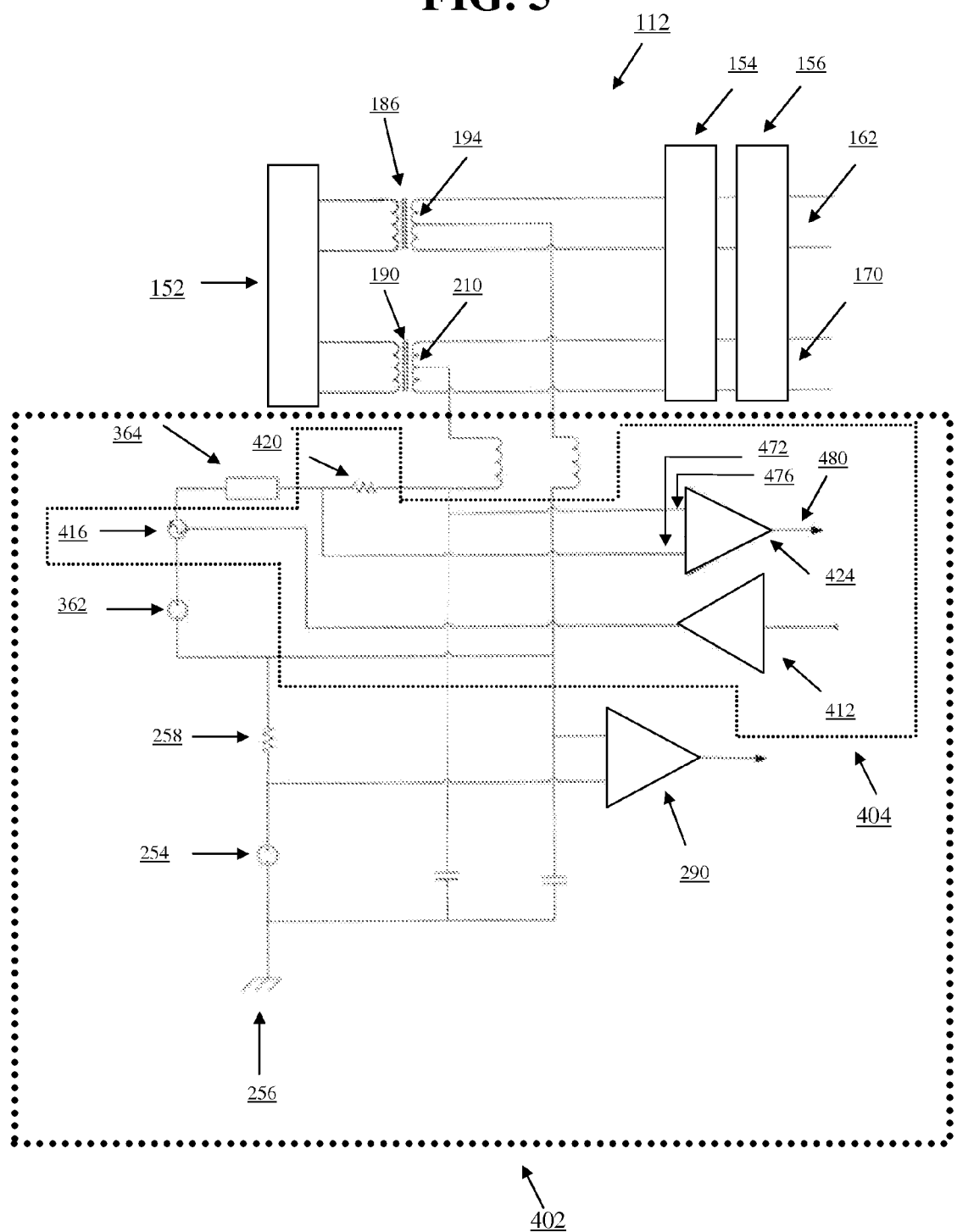
FIG. 5 shows one embodiment of a fault signaling circuit for providing communication if a remote ground fault occurs in the system of FIG. 1.
Figure 6:
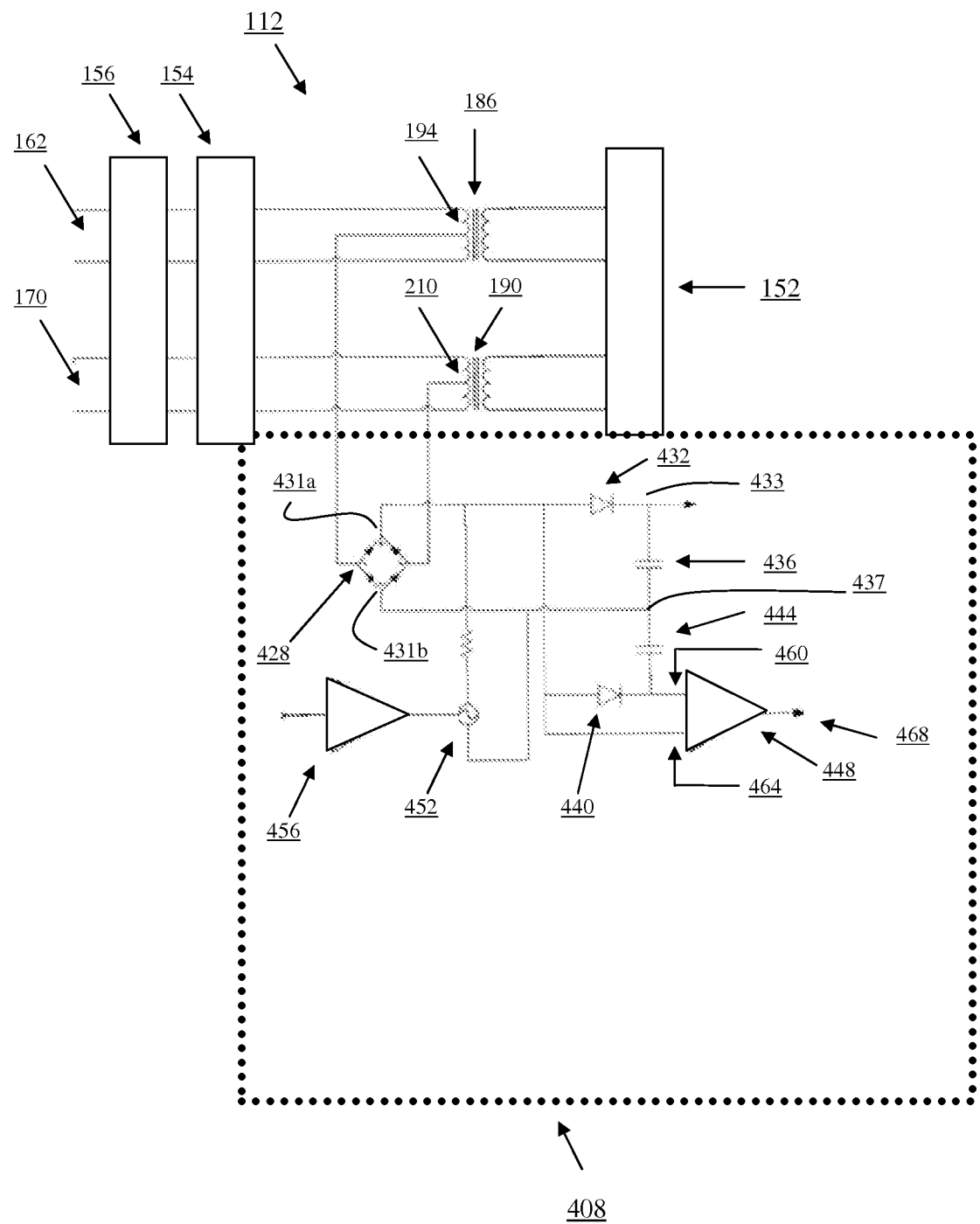
FIG. 6 shows a slave signal processor arrangement of the fault signaling circuit of FIG. 5.

As noted above, the system 100 may further include fault reporting equipment. As shown in FIGS. 5 and 6, the fault reporting equipment may include a fault signaling circuit 400 generally configured to provide a fail-safe communication channel between the first node (e.g., the fire alarm control panel 104) and the second node (e.g., the fire safety equipment 108). The fault signaling circuit 400 may inform the first node or fire alarm control panel 104 and/or the second node or fire safety equipment 108 that a ground fault has been detected in part of the communication channel 112 (e.g., in the receive conductor pair 170 of the Ethernet cable 150) and/or the communication channel 112 is otherwise comprised or not functional. The establishment of this fail-safe communication channel may be particularly beneficial when the fire safety equipment 108 has detected a fire, but the communication channel 112 is not working properly (due to, for example, the ground fault).

In this embodiment, the fault signaling circuit 400 is coupled to or connected with a fault detection system 402. The fault detection system 402 has components disposed and arranged so as to function similar to or consistent with the system 350 described in FIG. 4. The fault signaling circuit 400 is electrically connected to the PHY 152, the transmit conductor pair 162, and the receive conductor pair 170. In other embodiments, the fault signaling circuit 400 may be coupled to or connected with the fault detection system 250, the fault detection system 350, or any other fault detection system. In further embodiments, the fault signaling circuit 400 need not be used in connection with the fault detection systems 250, 350, 402, or any other fault detection system.

The fault signaling circuit 400 includes a master signal processor arrangement 404 (generally outlined in a box formed of dashed lines in FIG. 5) coupled to a slave signal processor arrangement 408 (outlined in a box formed of dashed lines in FIG. 6) via the coupling transformers 186, 190. In this embodiment, the master signal processor arrangement 404 is electrically connected to the transmit conductor pair 162 and the receive conductor pair 170, particularly the center taps of the coupling transformers 186, 190 employed in the first node 104 that may serve as a master node of the system 100, such as the fire alarm control panel shown in FIG. 1)). (see FIG. 5) As shown in FIG. 5, the master signal processor arrangement 404 includes an output amplifier circuit 412, a voltage modulator 416, a resistor 420, and an input amplifier circuit 424. In this embodiment, the slave signal processor arrangement 408 is electrically connected to the center taps 194, 210 of the coupling transformers 186, 190, respectively, that are employed in the second node 108 of the system 100, such as the fire safety equipment shown in FIG. 1 (see FIG. 6). As illustrated in FIG. 6, the slave signal processor arrangement 408 includes a full-wave rectifier 428, a first diode 432, a first capacitor 436 (e.g., a capacitor that has a capacitance of 100 µF or higher), a second diode 440, a second capacitor 444 (e.g., a capacitor that has a capacitance of approximately 10 µF), a differential amplifier circuit 448, a current modulator 452, and an amplifier circuit 456. In other embodiments, additional, different, or fewer components may be included in the master signal processor arrangement 404 and/or the slave signal process arrangement 408.

Starting with the master signal processor arrangement 404 shown in FIG. 5, the amplifier circuit 412 and the voltage modulator 416 are configured to modulate the raw POE voltage generated by the power source 362 by adding a signaling voltage onto the raw POE voltage. The signaling voltage may be a low-voltage differential signal, a digital pulse code modulation, a single frequency, frequency shift keying, etc., depending or based on the equipment 108 in the fire safety system 100. The signaling voltage may, for example, indicate that a ground fault has been detected by the ground fault detection system 402 (or, in other embodiments, the ground fault detection system 250 or any other ground fault detection system). The signaling voltage may also be indicative of other fire-safety system related communication (e.g., the fire alarm control panel 104 has detected a fire, but the Ethernet cable 150 is not working properly due to, for example, the presence of the ground fault).

The signaling voltage rides superimposed on the POE voltage as the combined POE voltage and the signaling voltage are transmitted from the master signal arrangement processor 404, through the center taps 194, 210 of the transformers 186, 190 employed in the first node 104 through the conductor pairs 162, 170, and through the center taps 194, 210 of the transformers 186, 190 employed in the second node 108, and to the signal arrangement processor 408 (see FIG. 6). In turn, the combined power and signal are coupled through the full wave rectifier 428, which allows both positive and negative signals to pass through. The first diode 432 and the first capacitor 436 are disposed relative to the positive and negative LC outputs 431a and 431b of the full wave rectifier 428 to extract the power from the combined POE voltage and signaling voltage at the output 433 which references the junction of the cathode of the diode 432 and a first terminal of the capacitor 436. The extracted power may be used to power or drive the fault signaling circuit 400, the fault detection system 250, the fire safety equipment 108, and/or other equipment connected or coupled to the communication channel 112 (e.g., downstream repeaters or extenders such as the first extender 600 and/or the second extender 604). Accordingly, a significant ripple voltage may be present at the junction 433 of the cathode of the diode 432 and the first terminal of the capacitor 436. The second terminal of the first capacitor 436 and the first terminal of the second capacitor 444 are connected at a junction 437 to the negative DC output 431b of the full wave rectifier 428. The anodes of both the first diode 432 and the second diode 440 are connected to the positive DC output 431a of the full wave rectifier 428. The cathode of the second diode 440 and the second terminal of the second capacitor 444 are connected to define the first input 460 of the amplifier 448. Together, the second diode 440 and the second capacitor 444 provide or supply an average DC voltage level at the first input 460 (described below) to the amplifier 448, where the voltage is isolated from small surges in power usage (i.e. small surges in the usage of power, supplied by, for example, the power source 362).

In one embodiment, the amplifier circuit 448 may include a low-pass filter and a comparator (e.g., to form a differential amplifier). As shown in FIG. 6, the amplifier circuit 448 has a first input 460, a second input 464, and an output 468. In this embodiment (when, e.g., the signaling voltage is digital pulse code modulation), the amplifier circuit 448 includes a low-pass filter and a comparator that compares the voltage (i.e. determines the difference between) at the first input 460 with the voltage at the second input 464. In another embodiment (when, e.g., the signaling voltage is a frequency or a range of frequencies), the amplifier circuit 448 may include an analog differential amplifier with a band-pass filter. In yet another embodiment, amplifier the circuit 448 may also include a hysteresis element and/or additional filtering.

In this embodiment, the voltage at the first input 460 is the average voltage level of the voltages provided or supplied by the second diode 440 and the second capacitor 444, respectively. The voltage at the second input 464 is the positive DC voltage of the combined signal received from the master signal arrangement processor 404. When, for example, the signaling voltage is superimposed on the POE voltage, the voltage at the second input 464 is higher than the voltage at the first input 460. When, however, no signaling voltage (no communication) is superimposed on the POE voltage, the voltage at the second input 464 is similar to (equivalent or within a pre-determined threshold difference of) the voltage at the first input 460. The comparator outputs or produces the output 468 based on the comparison of (difference between) the voltage at the first input 460 and the second input 464. In turn, the output 468 may be indicative of a communication from the master signal processor 404. The communication reflected by or corresponding to the signaling voltage may be instructions to any or all second nodes or fire safety equipment 108 and/or a request or poll to any or all of the second nodes or fire safety equipment 108 for information as to the status (e.g., the presence of any faults, alarms) of the fire safety equipment 108. As an example, the communication may be a basic data frame composed or bit patterns (e.g., 4 or 8 bit bytes) that delineate the data frame into a sequence of frames: (1) start; (2) destination address; (3) source address; (4) size; (5) payload (multiple bytes defined by size); (6) check (e.g., cyclic redundancy check), and (7) end. The basic data frame may contain fewer, additional, or different parts. The communication may also indicate that a ground fault has been detected and/or provide information to the fire safety equipment 108 or second node (e.g., the alarm control panel 104 or first node has detected a fire, but the communication channel 150 is not working). In effect, the amplifier circuit 448 allows the slave processor 408 to discriminate the voltage modulated signal (i.e., the combined POE voltage and signaling voltage) received from the master 404 and to determine whether communication corresponding to the signaling voltage (information regarding a fault detection and/or a request or poll for status information) has been sent from the master 404. Though not specifically depicted herein, the communication from the master processor 404 may be transmitted or communicated to the fire alarm control panel 104 or first node for subsequent transmission as the signaling voltage input to the amplifier 412 of the master processor 404.

Based on the communication received from the master processor 404 and processed by the slave processor 408, the slave processor 408 is further configured to generate a return or response signal (i.e. reply communication) and transmit this return signal to the master processor 404. More particularly, the circuit current modulator 452 and the input amplifier circuit 456 create or generate a current modulated return signal. The current modulated return signal may, for example, acknowledge receipt of the communication from the master processor 404, and/or provide the requested information (e.g., status of the safety equipment 108) and/or other information to the master processor 404. As an example, the signal may include a single frequency tone indicative of the condition of the fire safety equipment 108. A frequency tone of 500 Hz may be indicate that the safety equipment 108 is in a normal condition (e.g., the safety equipment 108 is performing normally), a tone of 800 Hz may indicate the presence of a ground fault, and a tone of 1200 Hz may indicate that the safety equipment 108 has detected an alarm (which cannot be communicated via the Ethernet cable 150 due to, for example, the presence of a ground fault). Additional, different, or fewer frequency tones may be used. For example, other frequency tones may be used to indicate or provide other desired status information.

Alternatively, the slave processor 408 may initiate (i.e., the processor 408 need not first receive communication from the master processor 404) the communication by generating a signal (i.e. communication) and transmitting this signal to the master processor 404. The signal may, as described above, provide status and/or other information to the master processor 404.

The current modulated return signal may be transmitted through the full wave rectifier 428, which, as noted above, allows both positive and negative signals (i.e. grants polarity immunity) to pass through. To prevent the master processor 404 and the slave processor 408 from simultaneously transmitting a communication over the communication channel 112 (via supplying a signaling voltage over the center tap 194, 210 of a conductor pair 162 and 170), the slave 408 may be configured to transmit a signaling voltage to or through the amplifier 456 only when no signaling voltage is received from the master as determined by the slave 408 not receiving a fault or communication represented by or corresponding to a signaling voltage superimposed onto the POE voltage. The signal is then transmitted from the slave processor 408, through the center taps 194, 210 of the transformers 186, 190, respectively, of the second node to the master processor 404 that is connected across the communication channel 112 to the first node 104. With reference again to FIG. 5, the signal from the slave processor 408, which is in the form of a varying current, travels or passes through the resistor 420. In turn, the signal travels to the circuit 424.

Though not specifically depicted herein, the circuit 424 may include a low-pass filter and a comparator (e.g., a differential amplifier). The circuit 424 removes any bulk average current being supplied or provided by the POE source 362 and the low-pass filter of the circuit 424 filters the signal. As shown in FIG. 5, the circuit 424 has a first input 472, a second input 476, and an output 480. The comparator of the circuit 424 compares the voltage at the first input 472 with the voltage at the second input 464. When the master processor 404 is not transmitting via the circuit 412 and a signaling voltage is received from the slave processor 408 on the center tap 210 of the first node, then the voltage at the first input 472 is the same as the voltage detected across the resistor 420 (the voltage due to varying current from the slave signal processor arrangement traveling through the resistor). The second input 476 is connected to a reference voltage, so the voltage at the second input 476 is the same as this reference voltage. The comparator outputs or produces the output 480 based on the comparison of (i.e. difference between) the voltage at the first input 472 and the second input 476. The output 480 is indicative of the response communication from the slave processor 408.

The above-described fault signaling circuit 400 creates or provides a simple communication channel between or over different portions of the Ethernet cable 150 by super-imposing a signaling voltage onto the conductor pair 170 via the corresponding center tap 210 associated with the node 104 or 108 where the fault signaling circuit 400 initiated the transmission of the signaling voltage or communication. Unlike a conventional Ethernet channel, this communication channel is a low bandwidth channel and does not require complex processing or an Ethernet address. As a result, communications about the system 100 (e.g., a fault has been detected in the Ethernet cable 150 or the first node or fire alarm control panel 104 has detected a fire) may be exchanged between the nodes 104 and 108 of the system 100, such as fire safety system components (e.g., the fire alarm control panel 104, fire safety equipment 108, etc.) even when the Ethernet cable 150 is no longer functional or working (e.g., because of a ground fault).

Figure 7:
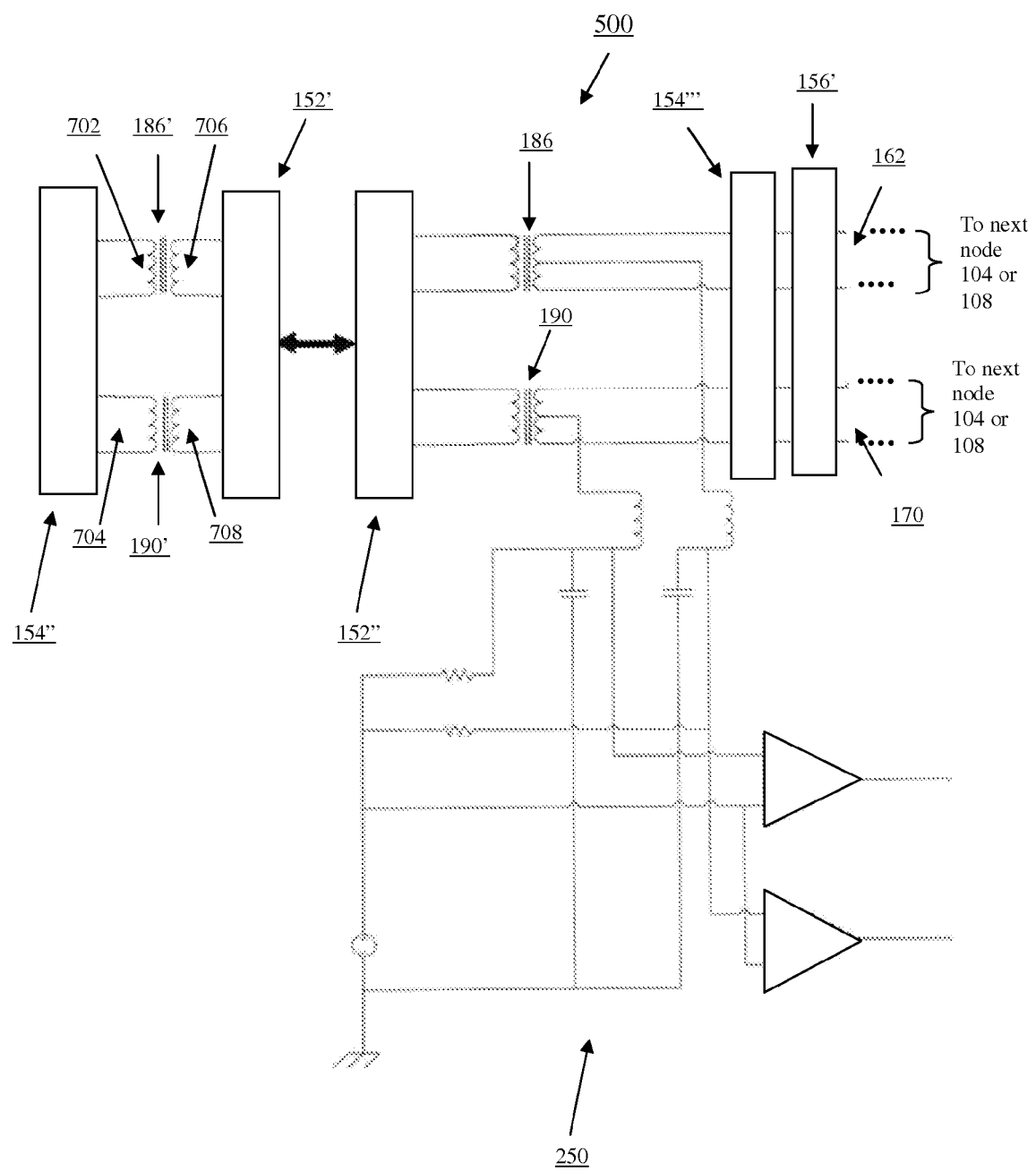
FIG. 7 shows one embodiment of an external unit for detecting a ground fault.

The ground fault detection systems and/or the ground fault signaling circuit described herein may also be provided in an external unit that may be connected to an existing Ethernet port, hub, switch, router, or other equipment to detect ground faults in an Ethernet network connected or coupled thereto. FIG. 7 illustrates an external unit 500 that has a connector (e.g., a jack) 154" to connect the external unit 500 to the existing hub, port, switch, router, etc. at or within the first node or fire alarm control panel 104 or the second node or safety equipment 108. The external unit 500 also has a connector (e.g., a jack) 154'" to connect the external unit 500 to a cable (e.g., the Ethernet cable 150). In this embodiment, coupling transformers 186', 190', PHY 152', PHY 152", the coupling transformers 186, 190, and the fault detection system 250 may be connected within the external unit 500. The external unit 500 thus provides an extended communication channel 112 between the panel 104 or the safety equipment 108 and the desired fire safety system equipment (e.g. the panel 104, the safety equipment 108, etc.), and ground fault detection across that communication channel 112. In other embodiments, the fault signaling circuit 400 may be connected within the external unit 500, such that the external unit also provides for fault signaling or communication in the event that the communication channel 112 is compromised. In other embodiments, other communication channels 112 and/or the fault detection system 350 or 402 or another fault detection system, instead of the fault detection system 250, may be connected within the external unit 500. The embodiment shown in FIG. 7 allows deployment of the fault detection system 250 and the fault signaling circuit to pre-existing nodes 104 and 108 without having to internally modify the existing nodes 104 or 108.

As shown in FIG. 7, the connector 154" is connected to and is configured to receive an Ethernet signal from the external hub, switch, router, etc. located at or within the node 104 or 108. The connector 154" is coupled to the PHY 152' via the coupling transformers 186', 190'. The PHY 152' is configured to receive the Ethernet signal from the respective node 104 or 108, via the connector 154, on the primary winding side 702 or 704 of the transformer 186' or 190'. The transformer 186' or 190' converts the received Ethernet signal into a media independent interface (MII) signal, present on the corresponding secondary winding side 706 or 708 of the transformer 186' or 190' for transmission to the PHY 152". The PHY 152", which is connected, back-to-back, with the PHY 152', receives the MII signal and converts the received MII signal back into the Ethernet signal originally received from the respective node 104 or 108 via the transformer 186' or 190'. In effect, the second PHY 152" regenerates the Ethernet signal while providing a physical isolation between the node 104 or 108 and the communication channel 112 or remaining cable comprising the conductor pairs 162 and 170. The ground fault detection system 250 is then configured to detect ground faults in the Ethernet signal present on the conductor pairs 162 and 170 in the manner described above.

The external unit 500 may be powered by or using POE. In one embodiment, the external unit 500 is powered with or using the power extracted from the combined POE voltage and signaling voltage at the output 433 (see FIG. 5). Though not specifically depicted herein, the output 433 may electrically connected to a DC-to-DC power converter that derives one or more voltages from the output 433. In turn, the one or more derived voltages may be supplied to the coupling transformers 186', 190', the bias generator 254 of the ground fault detection system 250, the first detection circuit 274, the second detection circuit 278, or combinations thereof, to power the external unit 500 and the fire safety equipment 108, other equipment connected to the communication channel 112 (e.g., other downstream repeaters or extenders), or combinations thereof. In other embodiments, the external unit 500, and the components thereof, may be powered in a different manner.

Figure 8:
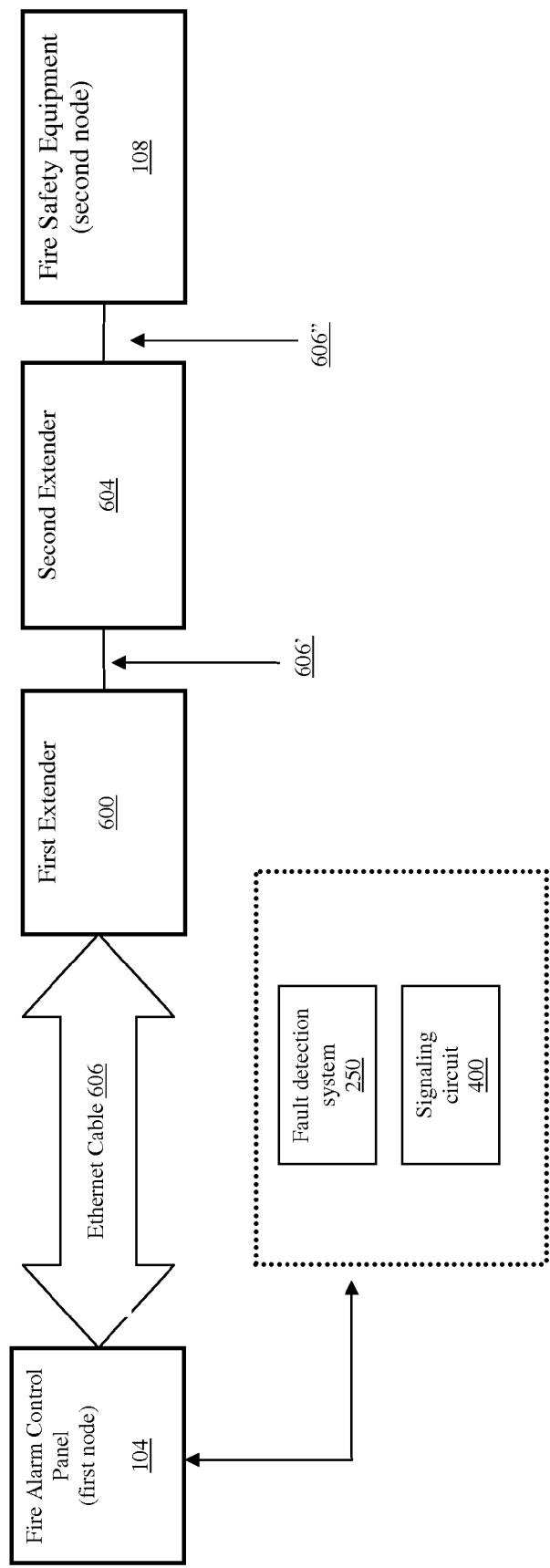
FIG. 8 shows one embodiment of first and second extenders that may be added to the system.

As shown in FIG. 8, the fire safety system 100 may further include a first extender 600 and a second extender 604 configured to extend the length of the communication channel 112 between one node 104 or 108 and another node 104 or 108, such as the fire alarm control panel 104 and the safety equipment 108. The fire safety system 100 may include additional, different, or fewer extenders between the fire alarm control panel 104 and the safety equipment 108.

As shown in FIG. 8, the fire alarm control panel 104 is connected or coupled with or to an Ethernet cable 606. The Ethernet cable 606 is similar to or consistent with the Ethernet cable 150 described above in connection with FIG. 2. Though not specifically depicted herein, the ground fault detection system 250 is electrically connected to the Ethernet cable 606, just as the ground fault detection system 250 is electrically connected to the Ethernet cable 150, described above in connection with FIG. 3. Alternatively, the ground fault detection systems 350,402 and/or other ground fault detection systems may be connected to the Ethernet cable 606 instead of the ground fault detection system 250.

In this embodiment, the first extender 600 includes the same components and performs the same function as the external unit 500. As such, the first extender includes the connector (e.g., a jack) 154" for connecting the extender 600 to the Ethernet cable 606 (described in further detail below). The first extender 600 may further include the fault detection system 250 and/or one component of the fault detection system signaling circuit 400, particularly the master processor 404 or the slave processor 408, described in connection with FIGS. 5 and 6. In this embodiment, the second extender 604 includes the same components and performs the same function as the first extender 600, with the exception that the second extender 604 may include the other component of the fault detection system signaling circuit 400. For example, if the first extender 600 includes the master processor 404, the second extender 604 may include the slave processor 408. The Ethernet cable 150', the fault detection system 250, and the fault detection system signaling circuit 400 in both the first and second extenders 600, 604 are connected together and perform the same function as described above.

In other embodiments, the second extender 604 may be different than the first extender 600 and/or first extender 600 and/or the second extender 604 may have fewer, additional, or different components. For example, the first extender 600 and/or the second extender 604 may include the fault detection systems 350, 404, or another fault detection system instead of the fault detection system 250. In some embodiments, the first extender 600 and/or the second extender 604 may instead be the fire alarm control panel node 104 or the fire safety equipment node 108 with the same circuitry to perform the same function.

As shown in FIG. 8, the fire alarm control panel or first node 104 is connected or coupled to an input end (i.e., input plug) of the Ethernet cable 606, which is similar to the Ethernet cable 150. The connector 154" of the first extender 600 is coupled or connected to an output end of the Ethernet cable 606 (i.e., the plug of the cable 606). The connector 154" is configured to receive an Ethernet signal from the respective node 104, 108 via the cable 606. In turn, the PHY 152' is configured to receive the Ethernet signal from the respective node 104 or 108, via the cable 606 and the connector 154, and convert the Ethernet signal into an MII signal for transmission to the PHY 152". The MII signal is received by the PHY 152", which is configured to convert the MII signal back into the original Ethernet signal (in effect regenerating the Ethernet signal). The first extender 600 may in turn be connected or coupled to an input end (e.g., a plug) of an Ethernet cable (e.g., cable 606', which is similar to the cable 606).

Though not depicted herein, the second extender 604 has a connector (e.g., a jack) coupled or connected to an output end (e.g., a plug) of the Ethernet cable 606'. The second extender 604 has another connector (e.g., a jack) positioned on the opposite end of the extender 604 relative to the first connector and coupled or connected to an input end (e.g., a plug) of an Ethernet cable (e.g., cable 606", which is similar to cable 606). The cable 606" may be connected to the equipment or node 108 via an output end (e.g., a plug) of the cable 606". In other embodiments, the cable 606" may be connected to further (e.g., third, fourth, etc.) extenders.

Though not specifically depicted herein, the node 104, the first extender 600, the second extender 604, the node 108, or combinations thereof, may include a disabling switch or circuit configured to disable the fault detection system 250, the fault detection system 350, other fault detection systems, the fault signaling circuit 400, other fault signaling circuits, or combinations thereof, when, for example, multiple components (e.g., nodes, extenders) in the fire safety system 100 have fault detection systems (e.g., the fault detection systems 250, 350) and/or fault signaling circuits (e.g., the fault signaling circuit 400).

By using one or more of the disclosed extenders, the length of the communication channel 112 may be extended. In this embodiment, the length of the communication channel 112 may be extended from approximately 100 meters (the length of the Ethernet cable 150) to 300 meters by using the first and second extenders 600, 604. At the same time, since the extenders 600, 604 include the ground fault detection system 250 and the fault signaling circuit 400, non-intrusive ground fault detection and ground fault signaling or communication, as described above, may be provided across or over the extended communication channel 112. In the event that the extended communication channel 112 is compromised (due to, for example, a ground fault), the fire alarm control panel 104 and the safety equipment 108 may remain in communication with one another by virtue of the fail-safe communication channel provided by the fault signaling circuits 400 in the extenders. For example, the slave processor 408 in the extender 600 may transmit information or communications to the master processor 404 in the extender 600, which may, in turn, be transmitted or provided to the slave processor 408 in the extender 604 and to the master processor 404 in the extender 604 until the information or communication reaches the safety equipment 108.

Figure 9:
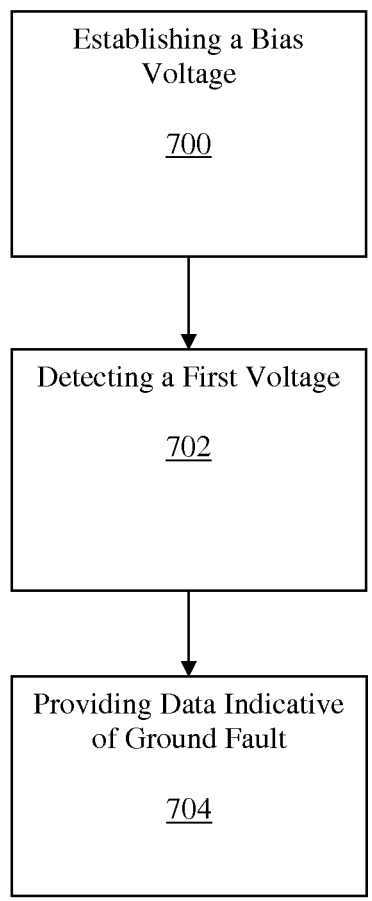
FIG. 9 shows a flow chart diagram of one embodiment of a method for detecting a ground fault in the system of FIG. 1.

Referring to FIG. 9, there is shown a flow chart depicting a method for detecting a ground fault in a communication channel. In one embodiment, the ground fault detection system 250 may be used. In other embodiments, a different system, such as the fault detection system 350 or the fault detection system 402, may be used. The method is implemented in the order shown, but may be implemented in or according to any number of different orders. Additional, different, or fewer acts may be provided.

The method includes establishing a bias voltage on a first portion of the communication channel and a second portion of the communication channel (act 700). The communication channel may be the communication channel 112 (which includes the Ethernet cable 150) or may be any other channel. The bias voltage may be a 12V DC bias voltage, a 6V DC bias voltage, or any other bias voltage. The first and/or second portions of the communication channel may correspond to transmit and/or receive conductors, respectively, of an Ethernet cable (e.g., the transmit and/or receive conductors 162, 170). More particularly, the first and second portions may correspond to one or more portions of a coupling transformer, such as a center tap or any other tap on the coupling transformer, connected to the transmit and/or receive conductors of the Ethernet cable. For example, the first and second portions may correspond to the center taps 194, 210. In one embodiment, the bias voltage is applied to the transformer tap that is the balancing point between a positive conductor and a negative conductor of a conductor pair (e.g., the conductors 162, 170) connected to the respective coupling transformer (e.g., coupling transformers 186, 190.

The method further includes detecting or sensing a first voltage across a first resistor (e.g., the resistor 258) electrically connected to the first and second portions of the communication channel (act 702). The first voltage may be detected by a first detection circuit (e.g., the detection circuit 274). The first detection circuit may have a comparator that compares the voltage at a first input with the voltage at a second input. The voltage at the first input may be the same as the voltage across the first resistor. The second input may be connected to a reference voltage, in which case the voltage at the second input is the same as this reference voltage. The first detection circuit may, for example, detect that the first voltage has developed across the first resistor when there is a difference between voltage at the first input and the voltage at the second input. The first detection circuit may, alternatively or additionally, have a window detector that determines whether the first input is outside of a window having an upper limit voltage and a lower limit voltage. More specifically, the window detector may determine whether the first input is outside of (i.e. less than) the lower limit voltage or is outside of (i.e. greater than) the upper limit voltage. The window detector may, for example, detect that the first voltage has developed across the first resistor when the voltage at the first input is outside of the voltage window or range.

The method further includes providing data indicative of the existence or presence of the ground fault based on the detecting (act 704). The providing may, for example, include providing data or a signal (e.g., the output 290) indicative of the ground fault in the first or second portions of the communication channel when the sensing point is non-zero (i.e. the detected first voltage is non-zero), exceeds or is greater than a positive threshold value (i.e. the detected first voltage exceeds or is greater than the positive threshold value), or is less than a negative threshold value (i.e. the detected first voltage is less than the negative threshold value). Alternatively, the providing may include providing data or a signal indicative of no ground fault in the first or second portions of the communication channel when the sensing point is zero (i.e. the detected first voltage is zero), does not exceed (is less than) the positive threshold value (i.e. the detected first voltage is less than the positive threshold value), or exceeds (is greater than) the negative threshold (i.e. the detected first voltage is greater than the negative threshold value).

The method may further include detecting or sensing a second voltage across a second resistor (e.g., the resistor 262) electrically connected to the first and second portions of the communication channel. The second voltage may be detected by a second detection circuit (e.g., the detection circuit 278). The second detection circuit may have a comparator that compares the voltage at a first input with the voltage at a second input. The voltage at the first input may be the same as the voltage across the second resistor. The second input may be connected to a reference voltage, in which case the voltage at the second input is the same as this reference voltage. The second detection circuit may, for example, detect that the first voltage has developed across the second resistor when there is a difference between voltage at the first input and the voltage at the second input. The first detection circuit may, alternatively or additionally, have a window detector that determines whether the first input is outside of a window having an upper limit voltage and a lower limit voltage. More specifically, the window detector may determine whether the first input is outside of (i.e. less than) the lower limit voltage or is outside of (i.e. greater than) the upper limit voltage. The window detector may, for example, detect that the first voltage has developed across the second resistor when the voltage at the first input is outside of the voltage window or range.

The method may further include providing, based on the detecting of the second voltage, data or a signal (e.g., the output 302) indicative of whether the ground fault exists in the second portion of the communication channel. The providing may, for example, include providing data or a signal indicative of the ground fault in the second portion of the communication channel when the sensing point is non-zero (i.e. the detected second voltage is non-zero), exceeds or is greater than a positive threshold value (i.e. the detected second voltage exceeds or is greater than the positive threshold value), or is less than a negative threshold value (i.e. the detected second voltage is less than the negative threshold value). Alternatively, the providing may include providing data or a signal indicative of no ground fault in the second portion of the communication channel when the sensing point is zero (i.e. the detected second voltage is zero), does not exceed (is less than) the positive threshold value (i.e. the detected second voltage is less than the positive threshold value), or exceeds (is greater than) the negative threshold (i.e. the detected second voltage is greater than the negative threshold value).

Various improvements described herein may be used together or separately. Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A ground fault detection system for detecting a ground fault in a system having a first node, a second node, and a communication channel between the first node and the second node, the ground fault detection system comprising:
    a bias generator electrically connected to the communication channel system, the bias generator having a first connection to ground and a second connection for output of a non-ground voltage, and the bias generator configured to establish a bias voltage on a first portion of the communication channel and a second portion of the communication channel;
    a first resistor electrically connected to the second connection of the bias generator to receive the non-ground voltage and electrically connected to the first and second portions of the communication channel, the first resistor being connected between the bias generator and the first and second portions of the communication channel; and
    a first detector circuit configured to detect a first voltage across the first resistor and configured to output, based on the detection of the first voltage, a signal indicative of whether the ground fault exists in the communication channel system.

2. The ground fault detection system of claim 1, wherein the communication channel comprises an Ethernet cable.

3. The ground fault detection system of claim 2, wherein the communication channel further comprises first and second coupling transformers coupled to the Ethernet cable.

4. The ground fault detection system of claim 3, wherein the first and second portions of the communication channel comprise first and second taps, respectively, on the respective first and second coupling transformers.

5. The ground fault detection system of claim 4, wherein the first and second taps are center taps on the first and second coupling transformers.

6. The ground fault detection system of claim 1, wherein when the first voltage across the first resistor is outside of a threshold window, the first detector circuit is configured to output a signal indicative of the ground fault in the communication channel.

7. The ground fault detection system of claim 1, wherein when the first voltage across the first resistor is within a threshold window, the first detector circuit is configured to output a signal indicative of no ground fault in the communication channel.

8. The ground fault detection system of claim 1, further comprising:
    a power source configured to supply power to the second node.

9. A ground fault detection system for detecting a ground fault in a system having a first node, a second node, and a communication channel between the first node and the second node, the ground fault detection system comprising:
    a bias generator electrically connected to the communication channel system and configured to establish a bias voltage on a first portion of the communication channel and a second portion of the communication channel;

a first resistor electrically connected to the bias generator and the first and second portions of the communication channel;

a first detector circuit configured to detect a first voltage across the first resistor and configured to output, based on the detection of the first voltage, a signal indicative of whether the ground fault exists in the communication channel system;

a second resistor electrically connected to the bias generator and the first and second portions of the communication channel; and a second detector circuit configured to detect a second voltage across the second resistor and configured to output, based on the detection of the second voltage, a signal indicative of whether the ground fault exists in the second portion of the communication channel.

10. The ground fault detection system of claim 9, wherein when the second voltage across the second resistor is non-zero or exceeds a threshold value, the second detector circuit is configured to output a signal indicative of the ground fault in the second portion of the communication channel.

11. The ground fault detection system of claim 9, wherein when the second voltage across the second resistor is zero or less than a threshold value, the second detector circuit is configured to output a signal indicative of no ground fault in the second portion of the communication channel.

12. The ground fault detection system of claim 9, wherein, when the first detector circuit outputs the signal indicative of the ground fault, the ground fault is in the first portion of the communication channel.

13. A method for detecting a ground fault in a communication channel between a first node and a second node, the method comprising:

establishing a bias voltage on a first portion of the communication channel and a second portion of the communication channel, the bias voltage being established with a bias voltage source having a non-ground output connected to the first and second portions through a resistor;

detecting a first voltage between the first and second portions of the communication channel; and providing data indicative of whether the ground fault exists in the first or second portions of the communication channel, the providing based on a comparison of the bias voltage on the first or second portion of the communication channel to a voltage across the resistor.

14. The method of claim 13, wherein providing comprises outputting data indicative of the ground fault in the first or second portions of the communication channel when the detected first voltage is outside of a threshold range relative to the bias voltage.

15. The method of claim 13, wherein providing comprises outputting data indicative of no ground fault in the first or second portions of the communication channel when the detected first voltage is within a threshold range relative to the bias voltage.

16. The method of claim 13, wherein the communication channel comprises an Ethernet cable coupled to first and second coupling transformers.

17. The method of claim 16, wherein the first and second portions of the communication channel comprise first and second center taps, respectively, on the respective first and second coupling transformers.

18. A method for detecting a ground fault in a communication channel between a first node and a second node, the method comprising:

establishing a bias voltage on a first portion of the communication channel and a second portion of the communication channel;

detecting a first voltage between the first and second portions of the communication channel;

providing data indicative of whether the ground fault exists in the first or second portions of the communication channel, the providing based on the detecting;

detecting a second voltage developed across a second resistor electrically connected to the first and second portions of the communication channel; and providing a signal indicative of whether the ground fault exists in the second portion of the communication channel, the providing based on the detection of the second voltage.

19. A fire safety system having a fire alarm control panel coupled to fire safety equipment via a communication channel, the fire safety system comprising:

a power supply configured to provide power over the communication channel;

a ground fault detection system configured to detect a ground fault on the communication channel, the ground fault detection system comprising:

a bias generator electrically connected to the communication channel and configured to establish a bias voltage on a first portion of the communication channel and a second portion of the communication channel, the bias generator separate from the power supply; and a first detector circuit configured to detect a first voltage across a resistor, the first voltage being a difference from an output of the bias generator and the first or second portions of the communication channel, and the first detector circuit configured to output, based on the detection of the first voltage, an indication of whether the ground fault exists in the first or second portions of the communication channel.

20. The fire safety system of claim 19, further comprising a fault signaling circuit electrically connected to the ground fault detection system and configured to permit communication across the communication channel when the communication channel has been compromised, wherein the fault signaling circuit comprises a master signal processor arrangement and a slave signal processor arrangement coupled to the master signal processor arrangement.

21. The fire safety system of claim 19 wherein the ground fault detection system further comprises a second detector circuit configured to detect a second voltage between the first and second portions and configured to output, based on the detection of the second voltage, another indication of whether the ground fault exists in the second portion of the communication channel.

* * * * *